United States Patent
Liang et al.

(10) Patent No.: US 10,553,812 B2
(45) Date of Patent: Feb. 4, 2020

(54) ORGANIC ELECTROLUMINESCENT DEVICE AND MANUFACTURING METHOD THEREOF, DISPLAY DEVICE

(71) Applicants: BOE TECHNOLOGY GROUP CO., LTD., Beijing (CN); Beijing BOE Optoelectronics Technology Co., Ltd., Beijing (CN)

(72) Inventors: Fei Liang, Beijing (CN); Fei Dong, Beijing (CN); Xiuyun Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/773,179

(22) PCT Filed: Sep. 22, 2017

(86) PCT No.: PCT/CN2017/102937
§ 371 (c)(1),
(2) Date: May 3, 2018

(87) PCT Pub. No.: WO2018/176763
PCT Pub. Date: Oct. 4, 2018

(65) Prior Publication Data
US 2019/0074472 A1    Mar. 7, 2019

(51) Int. Cl.
*H01L 51/52* (2006.01)
*H01L 27/32* (2006.01)
(Continued)

(52) U.S. Cl.
CPC ...... *H01L 51/5215* (2013.01); *H01L 27/3276* (2013.01); *H01L 51/5012* (2013.01); *H01L 51/5262* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 9,709,841 B2 * | 7/2017 | Katsuta | G02F 1/133504 |
| 2010/0201242 A1 * | 8/2010 | Liu | G02B 5/0263 313/112 |
| 2015/0062492 A1 * | 3/2015 | Yamamoto | G02F 1/133524 349/64 |

FOREIGN PATENT DOCUMENTS

| | | |
|---|---|---|
| CN | 101158775 A | 4/2008 |
| CN | 104037359 A | 9/2014 |

(Continued)

OTHER PUBLICATIONS

First Office Action for Chinese Patent Application No. 201710197301.1 dated Feb. 14, 2018.

(Continued)

*Primary Examiner* — Fernando L Toledo
*Assistant Examiner* — Valerie N Newton
(74) *Attorney, Agent, or Firm* — Calfee, Halter & Griswold LLP

(57) ABSTRACT

The present disclosure discloses an organic electroluminescent device, a manufacturing method thereof, and a display device. The organic electroluminescent device includes a base substrate. A light control layer is disposed on the base substrate. The light control layer includes a light transmitting structure and a light shielding structure disposed in the same layer and spaced from each other. The light shielding structure has a height h. The light transmitting structure has a width b. The light control layer is used for shielding and (Continued)

transmitting light emitted by the organic electroluminescent device so that an exit angle of the emitted light is within an angle θ.

9 Claims, 4 Drawing Sheets

(51) Int. Cl.
  *H01L 51/50* (2006.01)
  *H01L 51/56* (2006.01)

(56) References Cited

FOREIGN PATENT DOCUMENTS

| | | |
|---|---|---|
| CN | 104851394 A | 8/2015 |
| CN | 205900547 U | 1/2017 |
| CN | 106406530 A | 2/2017 |
| CN | 106910837 A | 6/2017 |
| JP | 2011154211 A | 8/2011 |
| JP | 2013050566 A | 3/2013 |
| WO | 2014069573 A1 | 5/2014 |

OTHER PUBLICATIONS

Search Report for International Patent Application No. PCT.CN2017/102937 dated Jan. 3, 2018.

\* cited by examiner

ORGANIC ELECTROLUMINESCENT DEVICE AND MANUFACTURING METHOD THEREOF, DISPLAY DEVICE

CROSS-REFERENCE TO RELATED APPLICATIONS

This application is based on and claims priority to Chinese Patent Application No. 201710197301.1, filed on Mar. 29, 2017, entitled ORGANIC ELECTROLUMINESCENT DEVICE AND MANUFACTURING METHOD THEREOF, DISPLAY DEVICE, the contents of which are incorporated herein by reference in its entirety.

TECHNICAL FIELD

The present disclosure relates to the field of display technology, and in particular to an organic electroluminescent device and a manufacturing method thereof, and a display device.

BACKGROUND

At present, an increasing number of display modules require a limitation on the observation angle for the purpose of anti-peeping. The existing anti-peeping technology is to add an anti-peeping function at an emitting layer of the organic electroluminescent device. The process of adding the anti-peeping function at the emitting layer must be performed within a processing chamber. However, as a boiling point of carbon is 4827° C., an excessive process temperature is likely to affect properties of a functional layer which has already evaporated on a substrate, finally affecting performances of the organic electroluminescent device.

SUMMARY

To the present disclosure provides an organic electroluminescent device, a manufacturing method thereof and a display device.

The present disclosure provides an organic electroluminescent device, including a base substrate, a light control layer being disposed on the base substrate, the light control layer comprising a light transmitting structure and a light shielding structure disposed in the same layer and spaced from each other, the light shielding structure having a height h, the light transmitting structure having a width b, the light control layer being used for shielding and transmitting light emitted by the organic electroluminescent device so that an exit angle of the emitted light is an angle θ.

In an implementation, an emitting layer is disposed on the light control layer, a cathode layer is disposed on the emitting layer, a component material of the light transmitting structure is a transparent conductive material, and a component material of the light shielding structure is carbon or light shielding metal.

In an implementation, a cathode layer is disposed on the base substrate, an emitting layer is disposed on the cathode layer, the light control layer is disposed on the emitting layer, a component material of the light transmitting structure is a transparent conductive material, and a component material of the light shielding structure is carbon or light shielding metal.

In an implementation, the light transmitting structure and the light shielding structure are strip structures disposed in parallel.

In an implementation, a width of the light shielding structure is a, a width of the light transmitting structure is b, a pitch of a raster formed by the light transmitting structure and the light shielding structure is p=a+b, where p ranges from one time a width of a pixel unit to twice the width of the pixel unit.

The present disclosure also provides a manufacturing method of an organic electroluminescent device, including:

forming a light control layer on a base substrate, in which the light control layer includes a light transmitting structure and a light shielding structure disposed in the same layer and spaced from each other, the light shielding structure has a height h, the light transmitting structure has a width b, and the light control layer is used for shielding and transmitting light emitted by the organic electroluminescent device so that an exit angle of the emitted light is an angle θ.

In an implementation, the manufacturing method of the organic electroluminescent device further includes:

forming an emitting layer on the light control layer;
forming a cathode layer on the emitting layer.

In an implementation, the step of forming a light control layer on the base substrate includes:

forming a light shielding layer on the base substrate, in which a component material of the light shielding layer is carbon or light shielding metal;

performing a patterning process on the light shielding layer to form a light shielding structure;

forming a light transmitting layer on the base substrate, in which a component material of the light transmitting layer is a transparent conductive material;

performing a patterning process on the light transmitting layer to form a light transmitting structure.

In an implementation, a temperature of a process of forming a light shielding layer on the base substrate ranges from 800° C. to 1200° C.

In an implementation, a width of the light shielding structure is a, a width of the light transmitting structure is b, a pitch of a raster formed by the light transmitting structure and the light shielding structure is p=a+b, where p ranges from one time a width of a pixel unit to twice the width of the pixel unit.

The present disclosure also provides a display device including any of the above-mentioned organic electroluminescent devices.

DETAILED DESCRIPTION

To enable those ordinary skilled in the art to better understand the technical solution of the present disclosure, an organic electroluminescent device and a manufacturing method thereof, a display device provided by the present disclosure will be described in detail below in conjunction with the accompanying drawing.

An embodiment of the present disclosure discloses an organic electroluminescent device including a base substrate. A light control layer is disposed on the base substrate. The light control layer includes a light transmitting structure and a light shielding structure disposed in the same layer and spaced from each other. The light shielding structure has a height h. The light transmitting structure has a width b. The light control layer is used for shielding and transmitting light emitted by the organic electroluminescent device so that an exit angle of the emitted light is an angle θ. By disposing the light control layer, part of the light emitted by the organic electroluminescent device is affected by the light shielding structure and cannot be emitted, thereby controlling a light-emitting angle of the entire organic electroluminescent device.

One Embodiment

Figure 1:
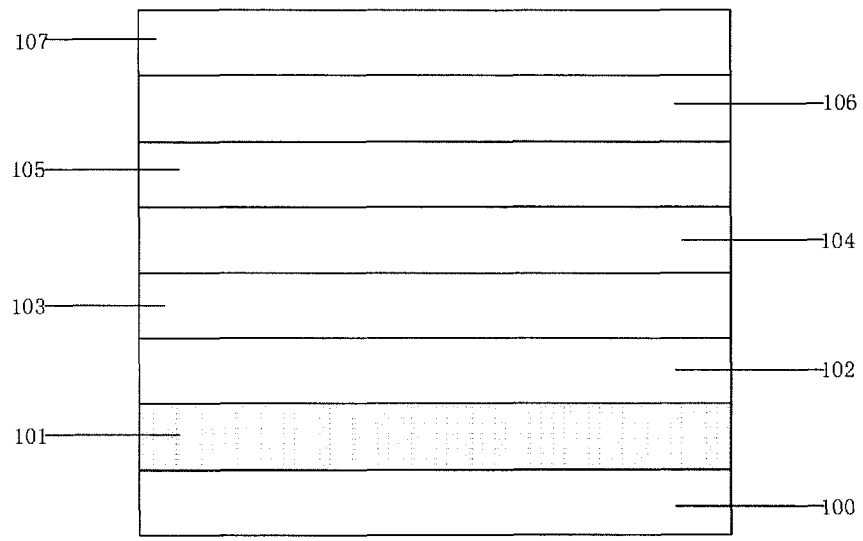
FIG. 1 is a schematically structural view of an organic electroluminescent device provided by a first embodiment of the present disclosure.
Figure 2:
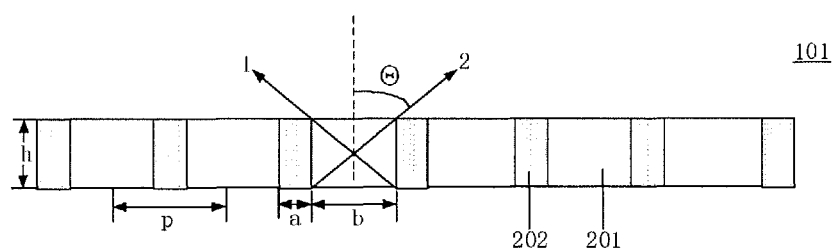
FIG. 2 is a schematically cross-section view of a light control layer shown in FIG. 1.
Figure 3:
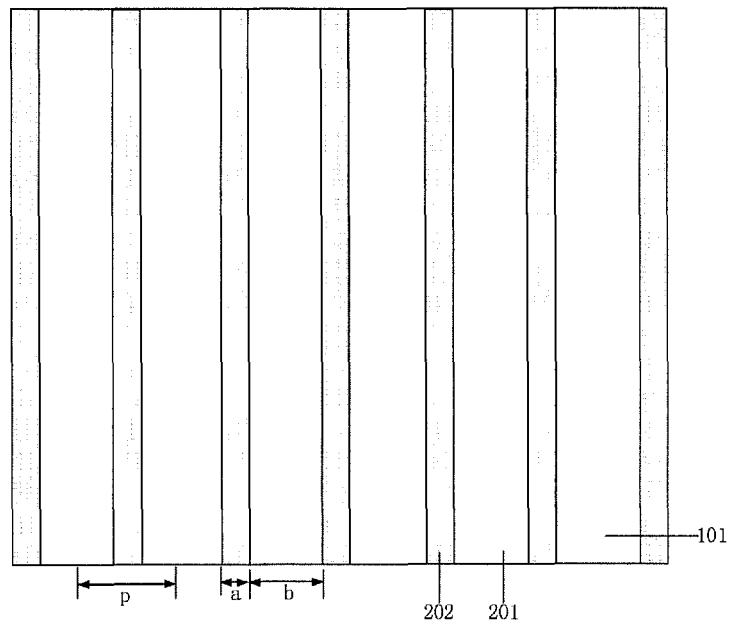
FIG. 3 is a top view of the light control layer shown in FIG. 2.

FIG. 1 is a schematically structural view of an organic electroluminescent device provided by a first embodiment of the present disclosure, FIG. 2 is a schematically cross-section view of a light control layer shown in FIG. 1, and FIG. 3 is a top view of the light control layer shown in FIG. 2. As shown in FIGS. 1, 2 and 3, the organic electroluminescent device includes a base substrate 100. A light control layer 101 is disposed on the base substrate 100. The light control layer 101 includes a light transmitting structure 201 and a light shielding structure 202 disposed in the same layer and spaced from each other. The light shielding structure 202 has a height h. The light transmitting structure 201 has a width b. The light control layer 101 is used for shielding and transmitting light emitted by the organic electroluminescent device so that an exit angle of the emitted light is an angle θ. In an implementation, an emitting layer 104 is disposed on the light control layer 101, and a cathode layer 107 is disposed on the emitting layer 104.

In the technical solution provided by this embodiment, the cathode layer is a reflective metal material. This embodiment is a bottom emitting typed organic electroluminescent device, in which a transparent anode layer of the organic electroluminescent device is disposed as a light control layer including a light transmitting structure 201 and a light shielding structure 202 disposed in the same layer and spaced from each other, so that an anti-peeping function is integrated into the transparent anode layer, thereby decreasing an overall thickness of a display substrate, and achieving the anti-peeping function of the display substrate under the premise of avoiding affecting a light-emitting property of the organic electroluminescent device.

With reference to FIG. 1, a hole injection layer 102 is disposed on the light control layer 101, a hole transport layer 103 is disposed on the hole injection layer 102, the emitting layer 104 is disposed on the hole transport layer 103, an electron transport layer 105 is disposed on the emitting layer 104, an electron injection layer 106 is disposed on the electron transport layer 105, and the cathode layer 107 is disposed on the electron injection layer 106. When a voltage is applied between the light control layer 101 and the cathode layer 107, a hole injected from the light control layer 101 and an electron injected from the cathode layer 107 enter into a recombination zone of the emitting layer 104 to recombine and form an exciton under the driving of an external voltage, the exciton emitting a photon with radiative transition so as to form electroluminescence.

FIG. 3 is a top view of the light control layer shown in FIG. 2. With reference to FIGS. 2 and 3, the light transmitting structure 201 and the light shielding structure 202 are spaced from each other. The light transmitting structure 201 and the light shielding structure 202 are strip structures disposed in parallel. The light shielding structure 202 has a height h, the light transmitting structure 201 has a width b, an angle formed by a light 1 and a light 2 is a visible angle of view, half of the visible angle of view is θ, and thus tan θ=b/h can be obtained according to geometric principle. Therefore, this embodiment may control the exit angle of the emitted light of the organic electroluminescent device by adjusting the height h and the width b, finally achieving the purpose of anti-peeping.

In an implementation, a component material of the light transmitting structure 201 is a transparent conductive material, a component material of the light shielding structure 202 is carbon or light shielding metal. In this embodiment, the light control layer 101 is also an anode layer of the organic electroluminescent device. Therefore, both the light transmitting structure 201 and the light shielding structure 202 have conductive functions, so that the light control layer 101 can achieve the function of the anode layer. Preferably, a width of the light shielding structure 202 is a, the width of the light transmitting structure 201 is b, a pitch of a raster formed by the light transmitting structure 201 and the light shielding structure 202 is p=a+b, where p ranges from one time a width of a pixel unit to twice the width of the pixel unit. Of course, the pitch p of the raster may be specifically adjusted according to actual conditions.

Figure 4:
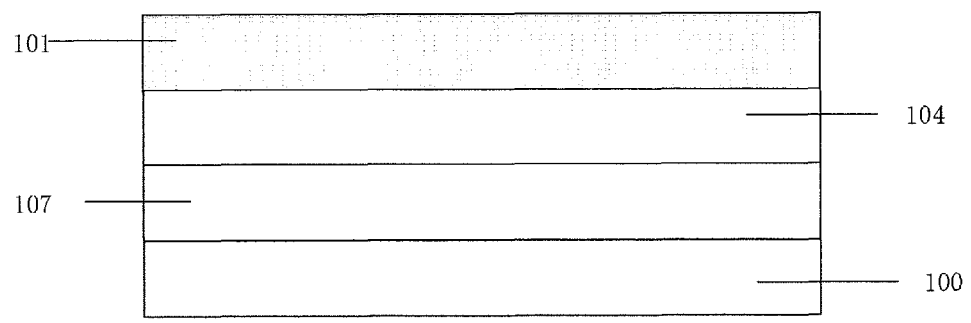
FIG. 4 is a schematically structural view of another organic electroluminescent device provided by the first embodiment of the present disclosure.

FIG. 4 is a schematically structural view of another organic electroluminescent device provided by the first embodiment of the present disclosure. As shown in FIG. 4, a cathode layer 107 is disposed on the base substrate 100, an emitting layer 104 is disposed on the cathode layer 107, and the light control layer 101 is disposed on the emitting layer 104. The embodiment shown in FIG. 4 is a top emitting typed organic electroluminescent device, in which a transparent anode layer of the organic electroluminescent device is disposed as a light control layer including a light transmitting structure 201 and a light shielding structure 202 disposed in the same layer and spaced from each other, so that an anti-peeping function is integrated into the transparent anode layer, thereby decreasing an overall thickness of a display substrate, and achieving the anti-peeping function of the display substrate.

The organic electroluminescent device provided by this embodiment includes a base substrate. A light control layer is disposed on the base substrate. The light control layer includes a light transmitting structure and a light shielding structure disposed in the same layer and spaced from each other. The light shielding structure has a height h. The light transmitting structure has a width b. The light control layer is used for shielding and transmitting light emitted by the organic electroluminescent device so that an exit angle of the emitted light is an angle θ. The technical solution provided by this embodiment is to dispose a transparent electrode layer as a light control layer including a light transmitting structure and a light shielding structure disposed in the same layer and spaced from each other, so that an anti-peeping function is integrated into the transparent anode layer, thereby decreasing an overall thickness of a display substrate, and achieving the anti-peeping function of the display substrate under the premise of avoiding affecting a light-emitting property of the organic electroluminescent device.

Other Embodiment

Figure 5:
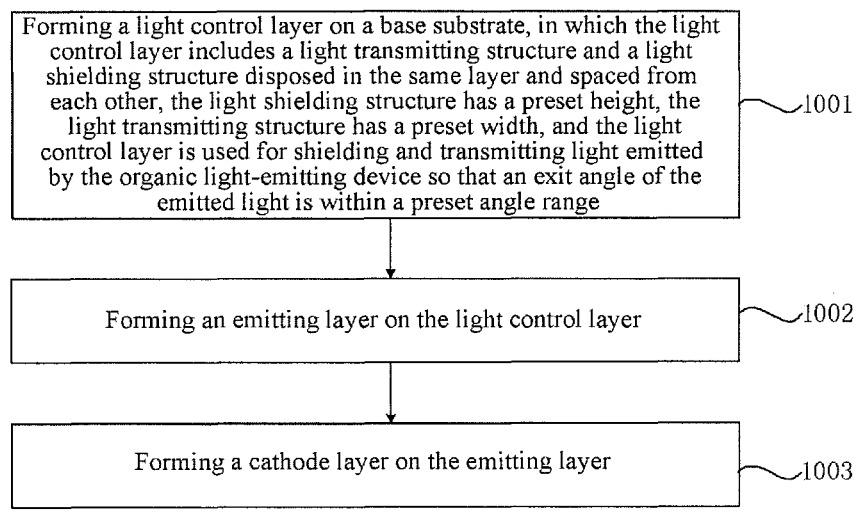
FIG. 5 is a flow chart of a manufacturing method of an organic electroluminescent device provided by a second embodiment of the present disclosure.
Figure 6:
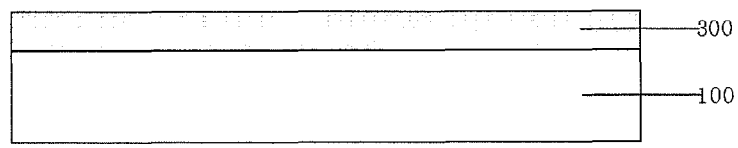
FIGS. 6-9 are schematic diagrams of forming a light control layer in the second embodiment.
Figure 7:
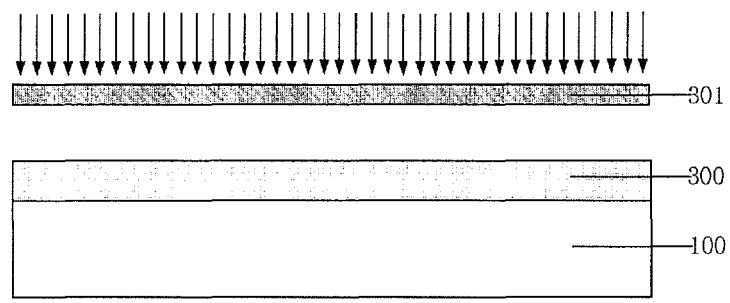
Figure 8:
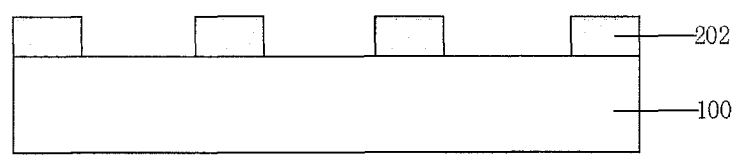
Figure 9:
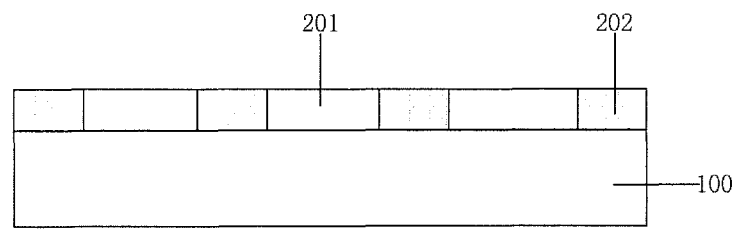

FIG. 5 is a flow chart of a manufacturing method of an organic electroluminescent device provided by a second embodiment of the present disclosure. As shown in FIG. 5, the manufacturing method of the organic electroluminescent device includes:

Step 1001: forming a light control layer on a base substrate, in which the light control layer includes a light transmitting structure and a light shielding structure disposed in the same layer and spaced from each other, the light shielding structure has a height h, the light transmitting structure has a width b, and the light control layer is used for shielding and transmitting light emitted by the organic electroluminescent device so that an exit angle of the emitted light is an angle θ.

Step 1002: forming an emitting layer on the light control layer.

Step 1003: forming a cathode layer on the emitting layer.

With reference to FIG. 1, a manufacturing method of the organic electroluminescent device provided by this embodiment further includes: forming a hole injection layer 102 on the light control layer 101, forming a hole transport layer 103 on the hole injection layer 102, wherein the emitting layer 104 is disposed on the hole transport layer 103. The manufacturing method of the organic electroluminescent device provided by this embodiment further includes: forming an electron transport layer 105 on the emitting layer 104, forming an electron injection layer 106 on the electron transport layer 105, wherein the cathode layer 107 is disposed on the electron injection layer 106. When a voltage is applied between the light control layer 101 and the cathode layer 107, a hole injected from the light control layer 101 and an electron injected from the cathode layer 107 enter into a recombination zone of the emitting layer 104 to recombine and form an exciton under the driving of an external voltage, the exciton emitting a photon with radiative transition so as to form electroluminescence.

In this embodiment, the step of forming a light control layer on the base substrate includes: forming a light shielding layer on the base substrate, in which a component material of the light shielding layer is carbon or light shielding metal; performing a patterning process on the light shielding layer to form a light shielding structure; forming a light transmitting layer on the base substrate, in which a component material of the light transmitting layer is a transparent conductive material such as indium tin oxide; performing a patterning process on the light transmitting layer to form a light transmitting structure.

FIGS. 6-9 are schematic diagrams of forming a light control layer in the second embodiment. As shown in FIGS. 6-9, a light shielding layer 300 is formed on the base substrate 100. A component material of the light shielding layer 300 is carbon or light shielding metal. The light shielding layer 300 is exposed and developed by a mask plate 301, and then etched to form a light shielding structure 202. A transparent conductive material is deposited on the light shielding structure, finally forming a light transmitting structure 201.

With reference to FIGS. 2 and 3, a width of the light shielding structure 202 is a, the width of the light transmitting structure 201 is b, a pitch of a raster formed by the light transmitting structure 201 and the light shielding structure 202 is p=a+b, where p ranges from one time a width of a pixel unit to twice the width of the pixel unit. Of course, the pitch p of the raster may be specifically adjusted according to actual conditions. A temperature of the process of forming a light shielding layer on the base substrate ranges from 800° C. to 1200° C. With reference to FIG. 2, the light transmitting structure 201 and the light shielding structure 202 are spaced from each other. The light shielding structure 202 has a height h, the light transmitting structure 201 has a width b, an angle formed by a light 1 and a light 2 is a visible angle of view, half of the visible angle of view is θ, and thus tan θ=b/h can be obtained according to geometric principle. Therefore, this embodiment may control the exit angle of the emitted light of the organic electroluminescent device by adjusting the height h and the width b, finally achieving the purpose of anti-peeping.

In the manufacturing method of the organic electroluminescent device provided by this embodiment, the organic electroluminescent device includes a base substrate. A light control layer is disposed on the base substrate. The light control layer includes a light transmitting structure and a light shielding structure disposed in the same layer and spaced from each other. The light shielding structure has a height h. The light transmitting structure has a width b. The light control layer is used for shielding and transmitting light emitted by the organic electroluminescent device so that an exit angle of the emitted light is an angle θ. The technical solution provided by this embodiment is to dispose a transparent electrode layer as a light control layer including a light transmitting structure and a light shielding structure disposed in the same layer and spaced from each other, so that an anti-peeping function is integrated into the transparent anode layer, thereby decreasing an overall thickness of a display substrate, and achieving the anti-peeping function of the display substrate under the premise of avoiding affecting a light-emitting property of the organic electroluminescent device.

Other Embodiment

This embodiment provides a display device including the organic electroluminescent device provided by the first embodiment. Reference may be made to the description of the first embodiment for the specific contents, which will not be repeated here.

In the display device provided by this embodiment, the organic electroluminescent device includes a base substrate. A light control layer is disposed on the base substrate. The light control layer includes a light transmitting structure and a light shielding structure disposed in the same layer and spaced from each other. The light shielding structure has a height h. The light transmitting structure has a width b. The light control layer is used for shielding and transmitting light emitted by the organic electroluminescent device so that an exit angle of the emitted light is an angle θ. The technical solution provided by this embodiment is to dispose a transparent electrode layer as a light control layer including a light transmitting structure and a light shielding structure disposed in the same layer and spaced from each other, so that an anti-peeping function is integrated into the transparent anode layer, thereby decreasing an overall thickness of a display substrate, and achieving the anti-peeping function of the display substrate under the premise of avoiding affecting a light-emitting property of the organic electroluminescent device.

It can be understood that the above embodiments are merely exemplary embodiments to illustrate the principle of the present disclosure. However, the present disclosure is not limited thereto. Various variations and improvements may be made without departing from the spirit and essence of the present disclosure, which are also considered to be within the protection scope of the present disclosure.

What is claimed is:

1. An organic electroluminescent device, comprising:
a base substrate, and
a transparent anode layer disposed on the base substrate, and the transparent anode layer being disposed as a light control layer comprising a light transmitting structure and a light shielding structure disposed in the same layer and spaced from each other, the light shielding structure having a height h, the light transmitting structure having a width b, the light control layer shielding and transmitting light emitted by the organic electroluminescent device so that an exit angle of the emitted light is an angle θ;
wherein an emitting layer is disposed on the light control layer, a cathode layer is disposed on the emitting layer, a component material of the light transmitting structure is a transparent conductive material, and a component material of the light shielding structure is carbon or light shielding metal;
a cathode layer is disposed on the base substrate, an emitting layer is disposed on the cathode layer, the light control layer is disposed on the emitting layer, a component material of the light transmitting structure is a transparent conductive material, and a component material of the light shielding structure is carbon or light shielding metal; and
a width of the light shielding structure is a, a width of the light transmitting structure is b, a pitch of a raster formed by the light transmitting structure and the light shielding structure is p=a+b, where p ranges from one time a width of a pixel unit to twice the width of the pixel unit.

2. The organic electroluminescent device according to claim 1, wherein the exit angle of the emitted light is adjusted by adjusting a ratio of the width b of the light transmitting structure and the height h of the light shielding structure.

3. The organic electroluminescent device according to claim 1, wherein the light transmitting structure and the light shielding structure are strip structures disposed in parallel.

4. A display device comprising the organic electroluminescent device according to claim 1.

5. The organic electroluminescent device according to claim 1, wherein the angle θ is half of the visible angle of view, and $\tan \theta = b/h$.

6. A manufacturing method of an organic electroluminescent device, comprising:
forming a transparent anode layer on a base substrate, the transparent anode layer light being disposed as a light control layer, wherein the light control layer comprises a light transmitting structure and a light shielding structure disposed in the same layer and spaced from each other, the light shielding structure has a height h, the light transmitting structure has a width b, and the light control layer shields and transmits light emitted by the organic electroluminescent device so that an exit angle of the emitted light is an angle θ;
forming a light shielding layer on the base substrate, wherein a component material of the light shielding layer is carbon or light shielding metal;
performing a patterning process on the light shielding layer to form a light shielding structure;
forming a light transmitting layer on the base substrate, wherein a component material of the light transmitting layer is a transparent conductive material;
performing a patterning process on the light transmitting layer to form a light transmitting structure;
wherein a width of the light shielding structure is a, a width of the light transmitting structure is b, a pitch of a raster formed by the light transmitting structure and the light shielding structure is p=a+b, where p ranges from one time a width of a pixel unit to twice the width of the pixel unit.

7. The manufacturing method of the organic electroluminescent device according to claim 6, further comprising:
forming an emitting layer on the light control layer;
forming a cathode layer on the emitting layer.

8. The manufacturing method of the organic electroluminescent device according to claim 6, wherein a temperature of a process of forming a light shielding layer on the base substrate ranges from 800° C. to 1200° C.

9. The manufacturing method of the organic electroluminescent device according to claim 7, wherein the angle θ is half of the visible angle of view, and $\tan \theta = b/h$.

* * * * *